United States Patent [19]
Horng

[11] Patent Number: 6,103,577
[45] Date of Patent: Aug. 15, 2000

[54] METHOD OF MANUFACTURING A FLASH MEMORY STRUCTURE

[75] Inventor: Weiching Horng, Tai-Chung, Taiwan

[73] Assignee: United Semiconductor Corp., Hsinchu, Taiwan

[21] Appl. No.: 09/213,345

[22] Filed: Dec. 17, 1998

[30] Foreign Application Priority Data

Aug. 20, 1998 [CN] China ................................... 87113703

[51] Int. Cl.⁷ ............................................. H01L 21/8247
[52] U.S. Cl. ........................... 438/262; 438/296; 438/529
[58] Field of Search .................................... 438/257, 259, 438/262, 263, 296, 297, 526, 529, 545

[56] References Cited

U.S. PATENT DOCUMENTS

| | | | |
|---|---|---|---|
| 4,713,142 | 12/1987 | Mitchell et al. | 438/262 |
| 5,371,030 | 12/1994 | Bergemont | 438/262 |
| 5,506,160 | 4/1996 | Chang | 438/262 |
| 5,635,415 | 6/1997 | Hong | 438/263 |
| 5,817,564 | 10/1998 | Church et al. | 438/529 |

*Primary Examiner*—Chandra Chaudhari
*Attorney, Agent, or Firm*—J.C. Patents; Jiawei Huang

[57] ABSTRACT

A flash memory structure is formed by a method comprising the steps of providing a semiconductor substrate, and then forming a shallow first trench within the substrate. Thereafter, a buried doped region is formed underneath the first trench so that the buried doped region is at a distance from the substrate surface. The buried doped region is one major aspect in this invention that can be applied to the processing of shallow trench isolation and is capable of reducing device area. Next, a deeper second trench is etched in the substrate. The second trench has a greater depth than the depth of the first trench. Subsequently, insulating material is deposited into the first and the second trench, and then a stacked gate structure is formed above the substrate. Later, the surface source region and drain region are formed on two sides of the stacked gate structure. Through thermal operation, the surface source region alternately connects with the buried doped region to form a buried common source region.

22 Claims, 7 Drawing Sheets

METHOD OF MANUFACTURING A FLASH MEMORY STRUCTURE

CROSS-REFERENCE TO RELATED APPLICATION

This application claims the priority benefit of Taiwan application Ser. No. 87113703, filed Aug. 20, 1998, the full disclosure of which is incorporated herein by reference.

BACKGROUND OF THE INVENTION

1. Field of Invention

The present invention relates to a method of manufacturing a flash memory structure. More particularly, the present invention relates to a flash memory structure that utilizes shallow trench isolation (STI) process to form a buried common source.

2. Description of Related Art

Conventional flash memory is a type of erasable programmable read-only memory (EPROM). Many articles have been written about flash memories. In general, the gate of a flash memory includes a polysilicon floating gate, which is used for storing electric charges, and a control gate, which is used for controlling the access of data. Therefore, EPROM normally has two gate terminals with the floating gate located below the control gate. The control gate and the word line are usually connected, and the floating gate is usually in a "floating" state. In other words, the floating gate is not in contact with any other circuits. An outstanding property of flash memory is its ability to perform a fast, block-by-block memory erase instead of the slow, bit-by-bit erase as in conventional EPROMs. Consequently, speed of operation of a flash memory is very fast. Often, the entire memory can be erased within one or two seconds.

FIG. 1 is the top view of a conventional flash memory structure. In FIG. 1, the control gate 10 is used as a word line. The metallic bit line 12 and the control gate 10 run across each other perpendicularly. On each side of the control gate 10, a drain region 14 and a common source 16 are present. There is a contact window 18 above the drain region 14 for coupling electrically with the bit line 12. Furthermore, field oxide layers 13 surround the aforementioned device for insulation.

FIG. 2A is a cross-sectional view along line 2I—2I of FIG. 1 that shows a conventional flash memory structure. FIG. 2B is a cross-sectional view along line 2II—2II of FIG. 1. First, as shown in FIG. 2A, a common source region 16 is formed within a semiconductor substrate 11. Next, as shown in FIG. 2B, the common source region 16 is isolated by field oxide layers 13, and then control gates 10 are formed above the field oxide layers 13. The control gates 10 can be made from, for example, polysilicon. In order to avoid a coupling effect, a minimum distance "a" must be allowed between the control gate 10 and the common source region 16 as shown in FIG. 2B.

In general, this type of flash memory structure has several defects. Firstly, the field oxide insulation structure produces a rounded corner structure 19 in the common source region 16 close to the control gate 10 when viewed from above (as shown in FIG. 1). Secondly, the field oxide layer in this region has a lateral extension known commonly as the bird's beak as shown in FIG. 2B. Therefore, extra space "a" (as shown in FIG. 1 ) between the control gate 10 and the common source region 16 must be set aside to prevent an unwanted coupling effect.

Normally, most integrated circuits must have some form of insulation for isolating one device from its close neighbors. Field oxide layers used to be one of the most commonly used isolating structure. However, the field oxide layer has gradually been replaced by shallow trench isolation (STI) structures. At present, most flash memory structure uses shallow trench isolation. This is because STI has better structural properties than conventional field oxide structures, and furthermore can save chip area. Usually, shallow trench isolation is formed by first performing an anisotropic dry etching operation to form a trench in a substrate, and then depositing some oxide material into the trench.

However, when shallow trench isolation is applied to form a flash memory structure, the self-aligned method of fabricating a source terminal is no longer appropriate. Furthermore, if an active region is used to define the common source pattern, misalignment may occur. In addition, the area occupied by each device is still large. Moreover, if the common source region and the gate structure are too close together, and the gate oxide layer is too thin, unwanted coupling may still be produced, ultimately leading to a deterioration of device reliability.

In light of the foregoing, there is a need to improve the flash memory structure and method of manufacture

SUMMARY OF THE INVENTION

Accordingly, the present invention provides a method of manufacturing a flash memory structure. The structure includes a buried common source structure that can prevent misalignment problems and is capable of saving device area.

To achieve these and other advantages and in accordance with the purpose of the invention, as embodied and broadly described herein, the invention provides a method of manufacturing flash memory. The method comprises the steps of first providing a semiconductor substrate, and then forming a pad oxide layer and a mask layer above the substrate. Next, a photolithographic and etching operation is conducted to pattern the pad oxide layer and the mask layer, thereby forming a shallow first trench in the substrate. Thereafter, a first ion implantation is carried out using the mask layer as a mask to form a buried doped region underneath the first trench. Consequently, there is a distance of separation between the buried doped region and the top surface of the substrate. In the subsequent step, photolithographic and etching operations are again carried out to form a deeper second trench in the substrate. The second trench is used for device isolation. The second trench and the first trench overlap a little, and the first trench is only formed in a region where the common source region is ultimately formed. Then, insulating material is deposited into the first trench and the second trench. Subsequently, the mask layer and the pad layer are removed to form a flat insulation layer whose top is level with the top of the semiconductor substrate. Later, a second ion implantation is carried out for adjusting the threshold voltage of the device, and then a gate oxide layer is formed over the substrate. Next, a first polysilicon layer and a dielectric layer are formed over the gate oxide layer, and then the gate oxide layer, the first polysilicon layer and the dielectric layer are patterned. Thereafter, a second polysilicon layer is formed over the semiconductor substrate, and then the second polysilicon layer is again patterned so that the second polysilicon layer stretches across the substrate above the first polysilicon layer. The second polysilicon layer has a linear shape when viewed from the top. The first polysilicon layer, the dielectric layer and the second polysilicon layer together form a stacked gate structure. Next, a third ion implantation is carried out using the second polysilicon layer as a mask to form a surface source region and a surface drain region on each side of the second polysilicon layer. The surface source region and the buried doped region alternately connect with each other to form a common source region. The surface source region and the buried doped region are so implanted that concentration of impurities in those two regions is roughly the same.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
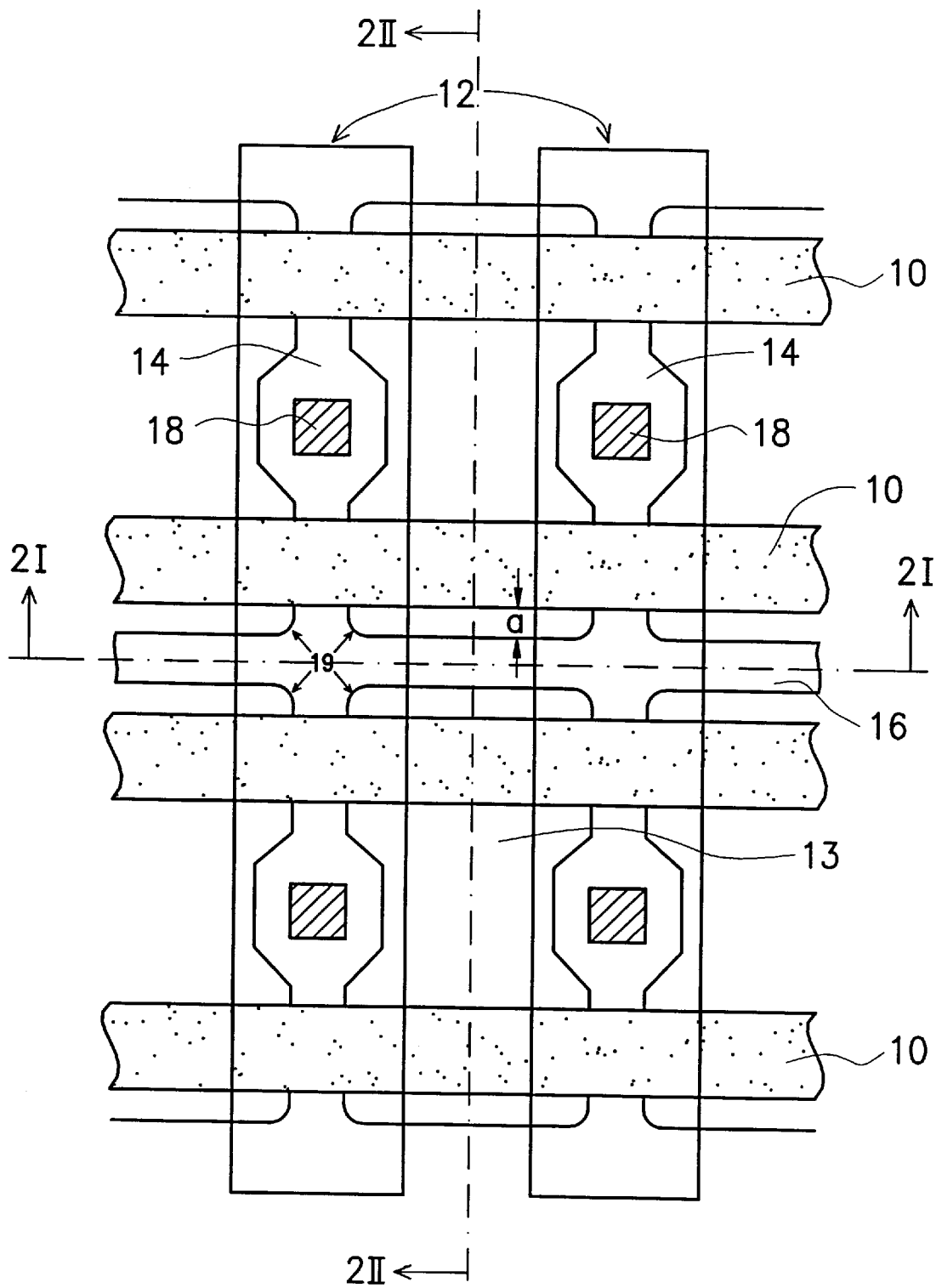
FIG. 1 is the top view of a conventional flash memory structure.
Figure 2A:
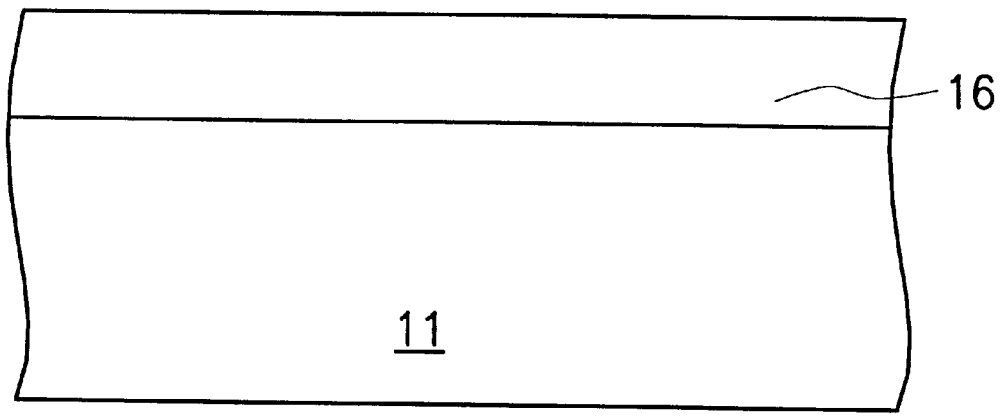
FIG. 2A is a cross-sectional view along line 2I—2I of FIG. 1 that shows a conventional flash memory structure.
Figure 2B:
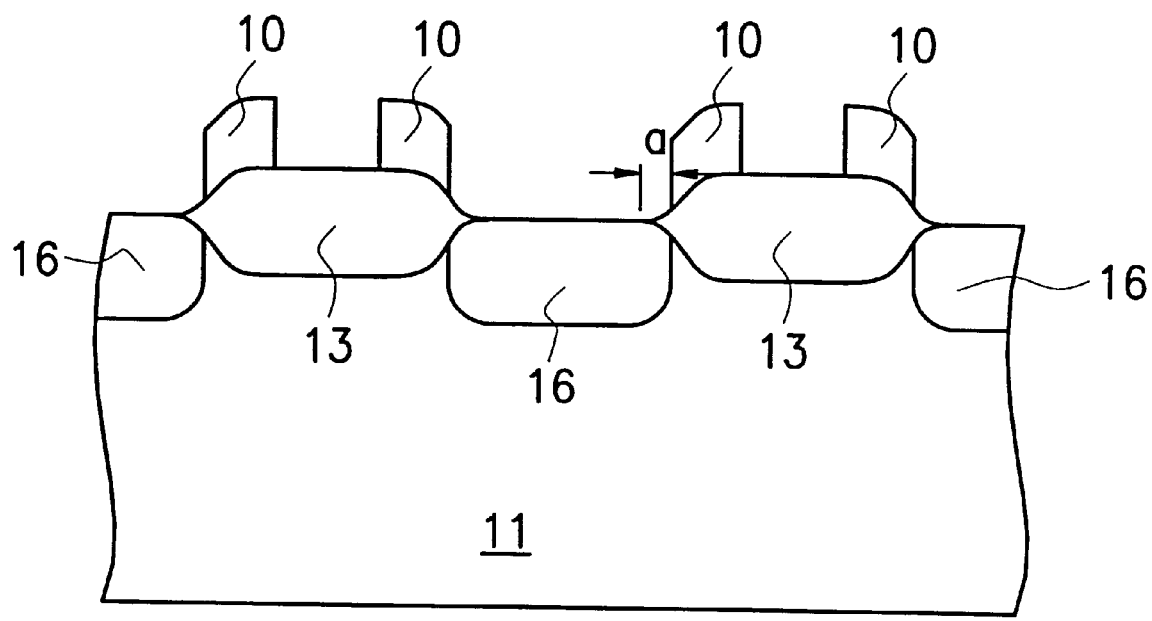
FIG. 2B is a cross-sectional view along line 2II—2II of FIG. 1.

Reference will now be made in detail to the present preferred embodiments of the invention, examples of which are illustrated in the accompanying drawings. Wherever possible the same reference numbers are used in the drawings and the description to refer to the same or like parts.

One major aspect of this invention is the formation of a buried common source structure that can be fabricated along with a shallow trench isolation (STI) structure. The structure can prevent conventional misalignment problems. Furthermore, although the common source terminal and the polysilicon layer overlap a little reliability of the device can still be maintained. Hence, area occupied by each device can be reduced.

Figure 3:
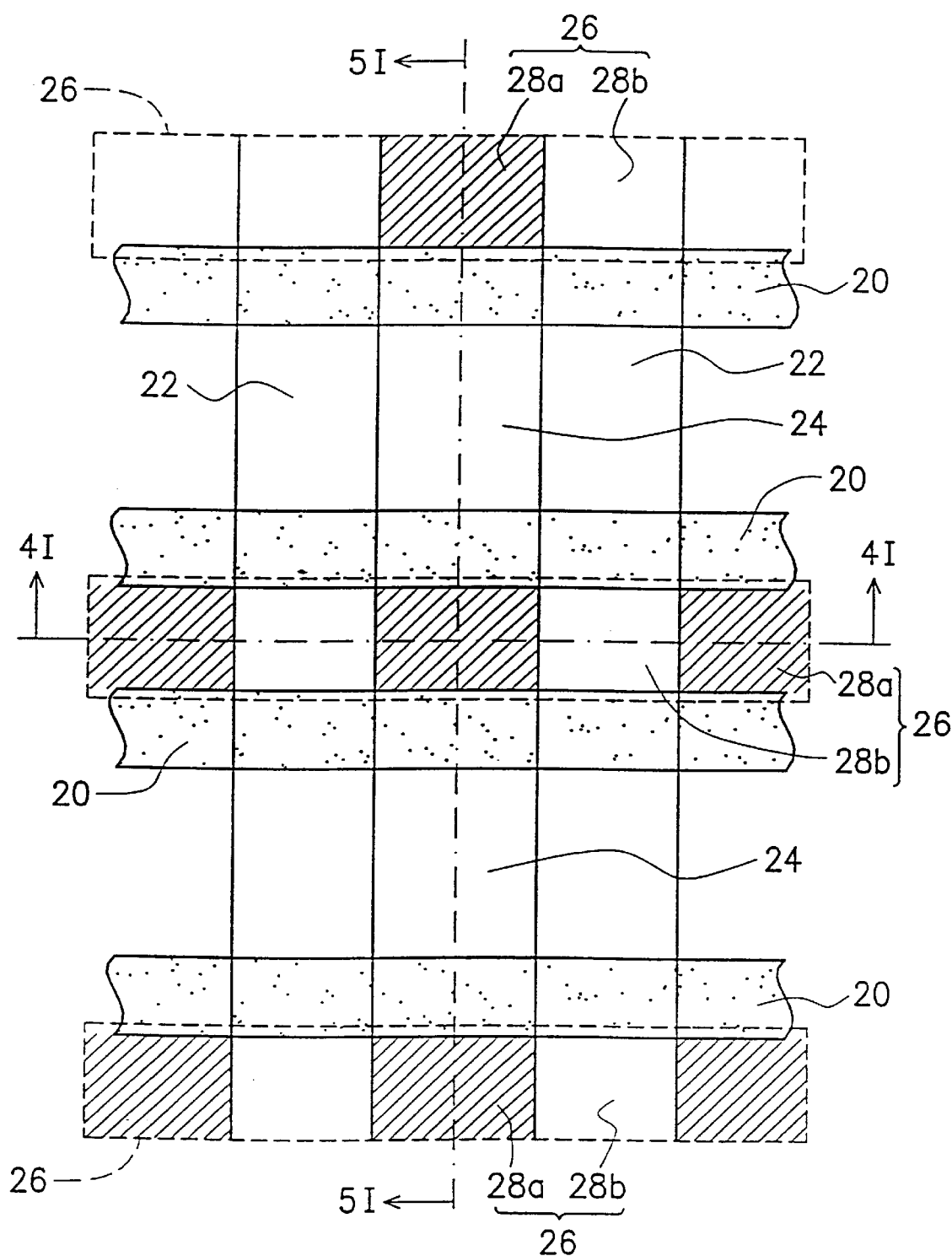
FIG. 3 is the top view of a flash memory structure fabricated according to one preferred embodiment of this invention.

FIG. 3 is the top view of a flash memory structure fabricated according to one preferred embodiment of this invention. In FIG. 3, control gates 20 serve as word lines, and metallic bit lines (not shown in the figure) are located above and perpendicular to the control gates 20. A drain region 22 and a common source region 26 are located on each side of the control gate 20. Furthermore, there is a contact window (not shown in the figure) above the drain region 22 for connecting electrically with the bit line.

The common source region 26 is formed by joining one or more buried doped regions 28a with one or more surface source regions 28b alternately together. Shallow trench isolation (STI) structures 24 are formed in the blank region between various devices. Processing operations necessary for forming the flash memory structure are explained in more detail below with reference to FIGS. 4A through 4F and FIGS. 5A through 5F.

FIGS. 4A through 4F are cross-sectional views along line 4I—4I of FIG. 3 showing the progression of manufacturing steps for producing a flash memory structure. FIGS. 5A through 5F are cross-sectional views along line 5I—5I of FIG. 3 again showing the progression of manufacturing steps for producing a flash memory structure.

Figure 4A:
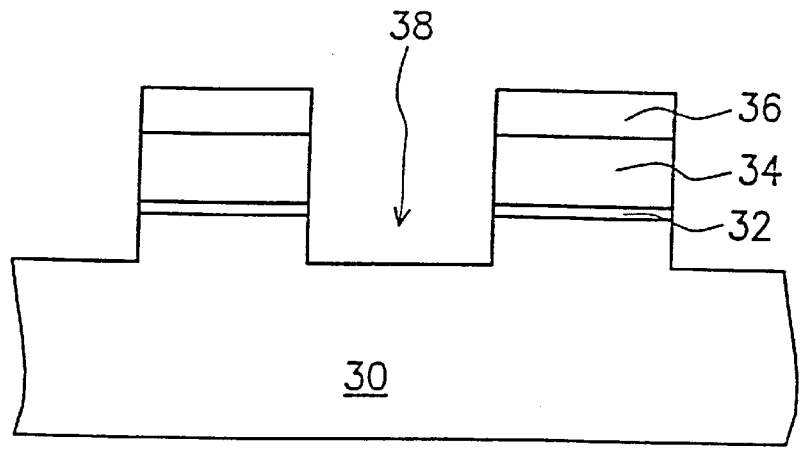
FIGS. 4A through 4F are cross-sectional views along line 4I—4I of FIG. 3 showing the progression of manufacturing steps for producing a flash memory structure.
Figure 5A:
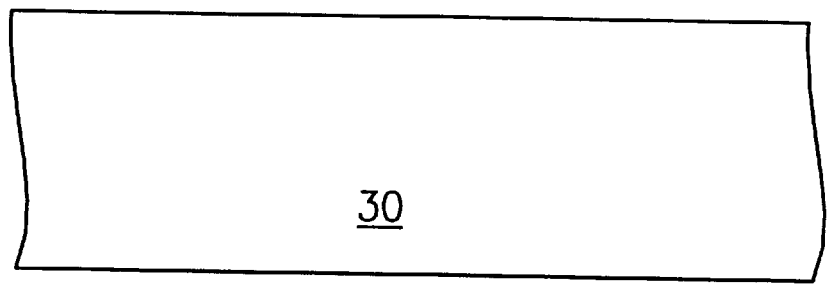
FIGS. 5A through 5F are cross-sectional views along line 5I—5I of FIG. 3 showing the progression of manufacturing steps for producing a flash memory structure.

First, as shown in FIGS. 4A and 5A, a semiconductor substrate 30 is provided. Then, a pad oxide layer 32 having a thickness of about 100 Å to 500 Å is formed over the substrate 30. Thereafter, a silicon nitride (SiN) layer 34 is formed over the pad oxide layer 32. The silicon nitride layer 34 preferably having a thickness of about 1000 Å to 3000 Å is formed using, for example, a chemical vapor deposition (CVD) method. In the subsequent step, photolithographic operation is carried out to form a patterned photoresist layer 36 over the silicon nitride layer 34. Then, an anisotropic etching operation is carried out to pattern the silicon nitride layer 34 and the pad oxide layer 32. A portion of the semiconductor substrate 30 is also etched away forming a first trench 38 having a depth of between 500 Å to 3000 Å.

Figure 4B:
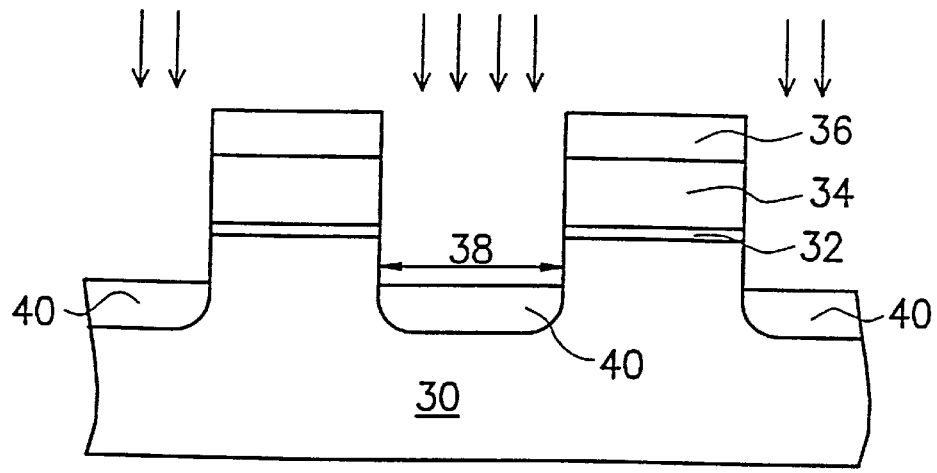
Figure 5B:
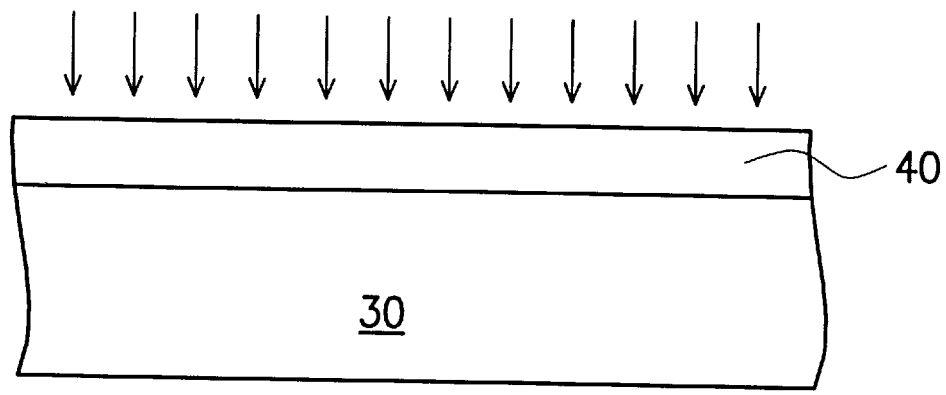

Next, an ion implantation is carried out implanting ions into the substrate 30 underneath the first trench 38 to form a buried doped region 40 as shown in FIGS. 4B and 5B. For example, arsenic or phosphorus ions having a dosage level of about $10^{15}$ atoms/cm$^3$ are used in the implantation. The buried doped region 40 represents one major aspect of this invention because device area can be saved.

Figure 4C:
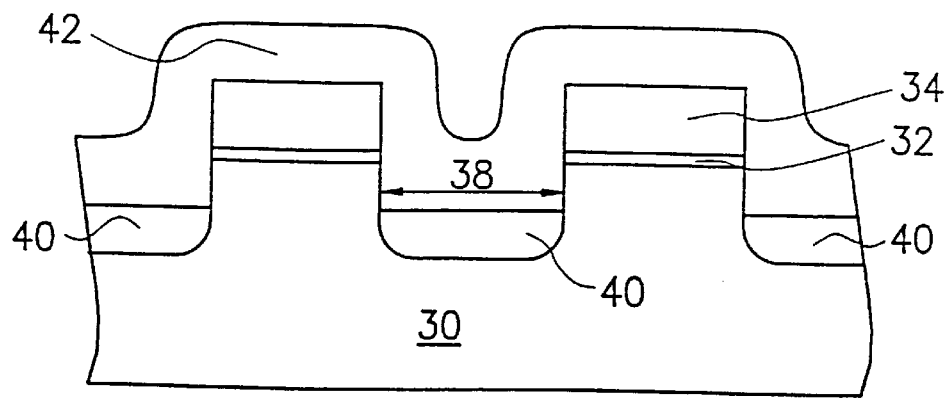
Figure 5C:
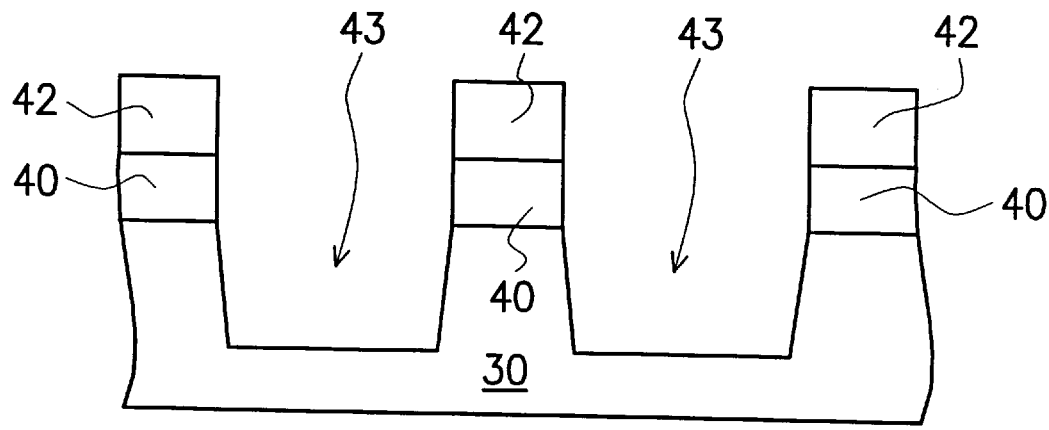

Next, as shown in FIGS. 4C and 5C, the photoresist layer 36 is removed. Then, photolithographic and anisotropic etching operations are carried out to form a patterned photoresist layer 42 over the silicon nitride layer 34. The patterned photoresist layer 42 covers only the common source region. Thereafter, using the photoresist layer 42 and the original silicon nitride layer 34 as a mask, the semiconductor substrate 30 is again etched to form a second trench 43 having a depth of between 3000 Å to 10000 Å. The trench 43 is later used to form a device isolation structure as well as to pattern out the active region in the semiconductor substrate 30. Note also that depth of the second trench 43 is treater than the depth of the first trench 38, and a portion of the second trench 43 and the first trench 38 overlaps. In addition, the second trench 43 etches away a portion of the buried doped region 40, and the first trench 38 only occupies the area where the source region is ultimately formed.

Figure 4D:
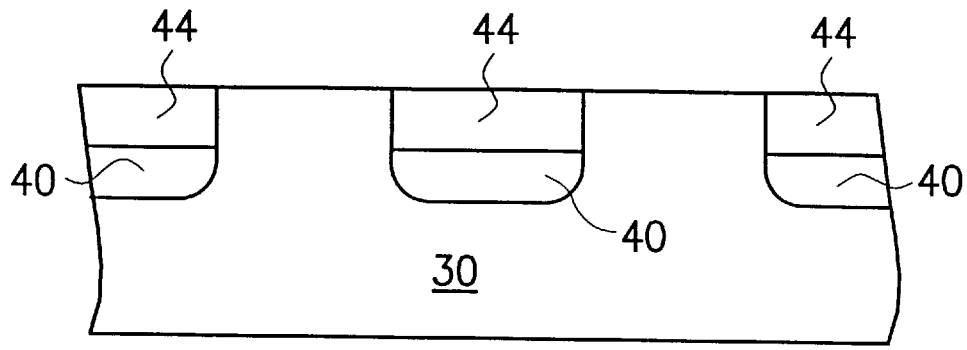
Figure 5D:
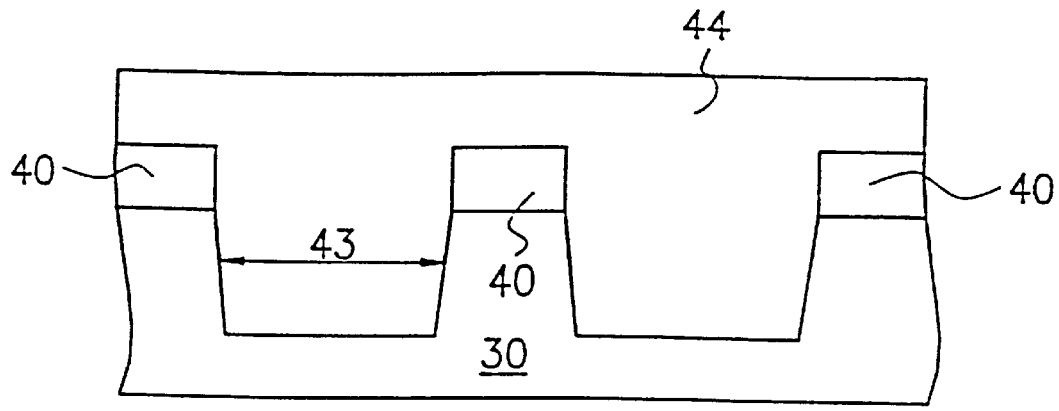

Next, as shown in FIGS. 4D and 5D, insulating material, for example, a silicon dioxide layer is deposited into the second trench 43 and the first trench 38 (FIG. 4A) to form an insulation layer 44. The insulation layer 44 can be formed using a chemical vapor deposition (CVD) method or an atmospheric pressure chemical vapor deposition (APCVD) method with tetra-ethyl-ortho-silicate (TEOS) as gaseous reagent. Thereafter, the insulation layer 44 is polished while the pad oxide layer 32 and the silicon nitride layer 34 are removed using, for example, a chemical-mechanical polishing (CMP) method.

Therefore, the top surface of the insulation layer 44 is planarized and at the same height level as the top surface of the substrate 30. At this stage of the processing operation, the insulation layer 44 covers the top of the buried doped region 40 so that the buried doped region 40 is at a distance from the top surface of the substrate 30. Subsequently, another implantation is carried out to adjust the threshold voltage of the device, and then a gate oxide layer (not shown in the figure) is formed.

Figure 4E:
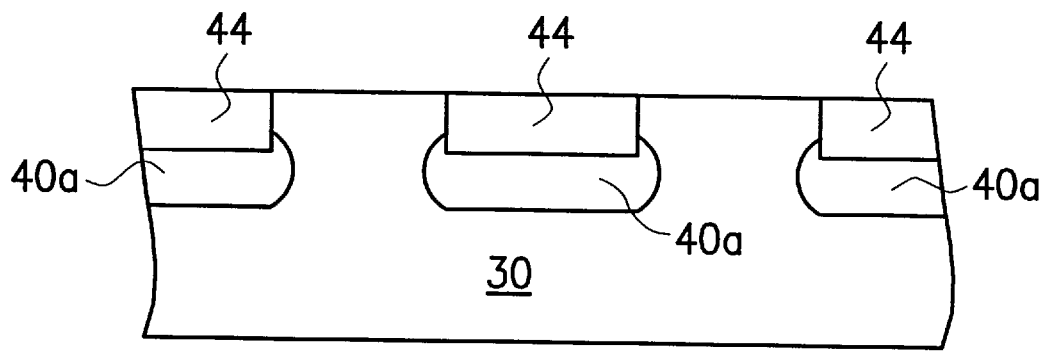
Figure 5E:
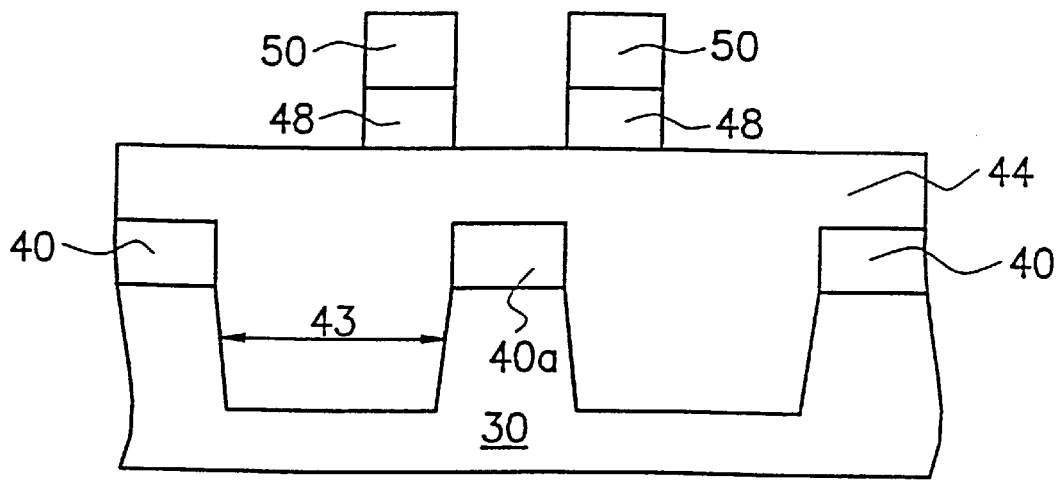

Next, as shown in FIGS. 4E and 5E, a first polysilicon layer and a thin dielectric layer (not shown in the figure) are formed over the substrate 30), and then the first polysilicon layer and the dielectric layer are patterned. Preferably, the dielectric layer is an oxide/nitride/oxide (ONO) composite layer. Due to processing heat, impurities within the buried doped region 40 diffuse outward a little, thereby forming a larger buried doped region 40a. Thereafter, a second polysilicon layer 48 is formed over the dielectric layer and the semiconductor substrate 30.

Subsequently, a photolithographic operation is carried out to form a photoresist layer 50 over the second polysilicon layer 48 for patterning the second polysilicon layer 48. Finally, the photoresist layer 50 is removed. The second polysilicon layer 48 is a linear structure (as shown in FIG. 3) that runs across above the first polysilicon layer. The first polysilicon layer (acting as a floating gate), the dielectric layer and the second polysilicon layer 48 (acting as a control gate) together forms a stacked gate structure. Since there is a thick oxide layer 44 between the buried doped region 40a and the second polysilicon layer 48, coupling between the second polysilicon layer 48 and the buried doped region 40a is greatly reduced. Hence, although the buried doped region 40a and the second polysilicon layer 48 may have some overlapping, area, reliability of the device can he maintained.

Figure 4F:
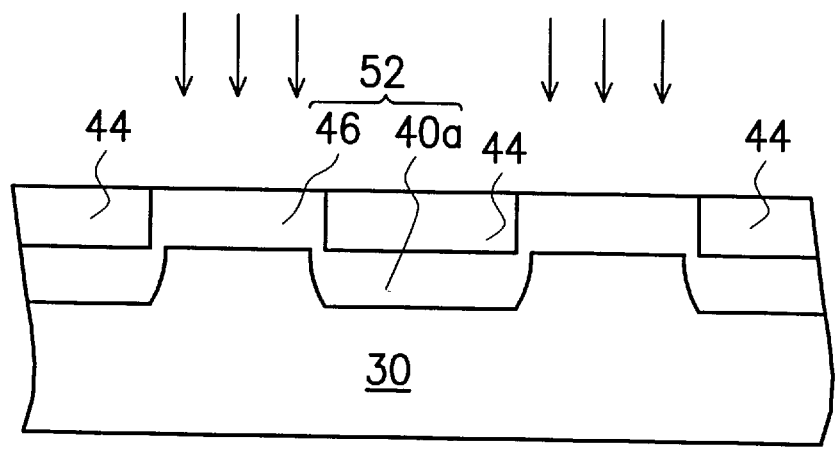
Figure 5F:
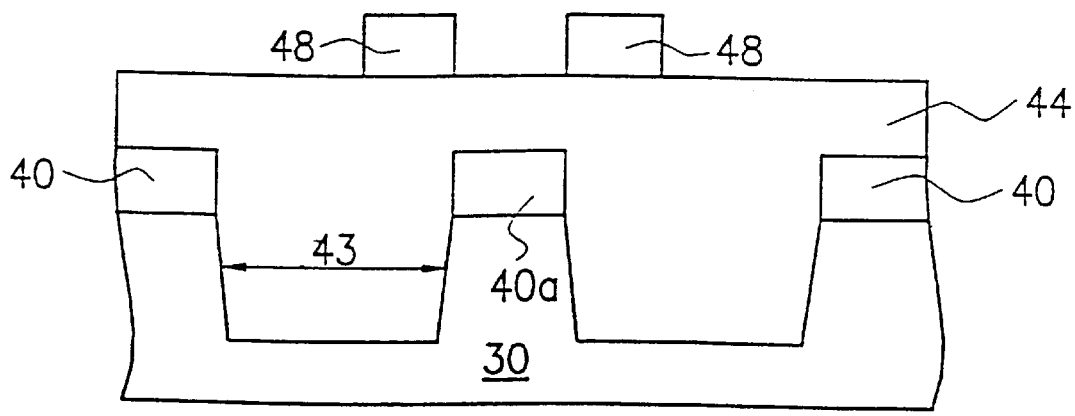

Next, as shown in FIGS. 4F and 5F, using the second polysilicon layer 48 as a mask, one further ion implantation is conducted to implant ions into the substrate 30 on each side of the second polysilicon layer 48 to form a surface source region 46 and a drain region (not shown in the figure). For example, arsenic or phosphorus ions with a dosage level of about $10^{15}$ atoms/cm are used in the implantation. The surface source region 46 has the same level of ion concentration as the buried doped region 40a. Through subsequent thermal cycles, the surface source region 46 and the buried doped region 40a connect together to form a buried common source region 52. Finally, a metallic interconnect structure is formed above the second polysilicon layer 48, thereby completing the flash memory structure of this invention.

In summary, the flash memory structure and its method of manufacture has advantages including:

1. The buried common source structure 52 and the shallow trench isolation (STI) structure can be conveniently processed together, and conventional misalignment problems can be prevented.

2. Between the buried doped region 40a and the second polysilicon layer 48, there is a thick oxide layer 44 acting as an insulation layer. Hence, coupling between the second polysilicon layer 48 and the buried doped region 40a can be greatly lowered. Therefore, although there may be some overlap between the buried doped region 40a and the second polysilicon layer above, reliability of the device can be maintained.

3. The flash memory structure of this invention can reduce area occupied by each device even further.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing flash memory, comprising the steps of:

providing a semiconductor substrate, and then forming a pad oxide layer and a mask layer over the substrate;

performing a photolithographic and an etching operation to pattern the pad oxide layer and the mask layer, at the same time etching out a shallow first trench in the substrate;

performing a first ion implantation using the mask layer as a mask to form a buried doped region in the substrate underneath the first trench;

performing a photolithographic and an etching operation to form a deep second trench in the substrate for device isolation, wherein the second trench overlaps with a portion of the first trench, while the first trench is formed only in places where a common source region is ultimately formed;

depositing insulating material into the first trench and the second trench, then removing the mask layer and the pad oxide layer so that a planar insulation layer whose upper surface is at the same height level as the top of the substrate is obtained;

forming a first polysilicon layer and a dielectric layer over the substrate, and then patterning, the first polysilicon layer and the dielectric layer, forming a second polysilicon layer over the semiconductor substrate, and then patterning the second polysilicon layer such that the second polysilicon layer having a linear structure stretches across the substrate above first polysilicon layer, and the first polysilicon layer, the dielectric layer and the second polysilicon layer together form a stacked gate structure; and performing a second ion implantation using the second polysilicon layer as a mask, thereby forming a surface source region and a drain region on each side of the second polysilicon layer, such that the surface source region and the buried doped region are joined alternately to form a common source region.

2. The method of claim 1, wherein the step of forming the mask layer includes depositing silicon nitride.

3. The method of claim 1, wherein the first trench has a depth smaller than the depth of the second trench.

4. The method of claim 1, wherein the step of forming the first trench includes performing an anisotropic dry etching operation of the substrate using the mask layer as a mask.

5. The method of claim 1, wherein the step of performing the first ion implantation includes implanting, arsenic or phosphorus ions at a dosage level of about $10^{15}$ atoms/cm$^3$.

6. The method of claim 1, wherein after the step of forming the buried doped region, further includes performing another implantation for adjusting the voltage threshold of the device, and then depositing oxide to form a gate oxide layer.

7. The method of claim 1, wherein the step of forming the insulation layer includes depositing silicon dioxide to fill the first and the second trench using tetraethyl-ortho-silicate (TEOS) as a gaseous reagent in a chemical vapor deposition.

8. The method of claim 1, wherein the step of forming the second trench includes performing, an anisotropic dry etching operation to etch the semiconductor substrate.

9. The method of claim 1, wherein after the step of depositing insulating material into the first and the second trench, further includes performing a chemical-mechanical polishing operation to planarize the insulation layer such that the top surface the insulation layer is at the same height level as the top of the substrate.

10. The method of claim 1, wherein the step of performing the second ion implantation includes implanting arsenic or phosphorus ions at a dosage level of about $10^{15}$ atoms/cm$^3$.

11. The method of claim 1, wherein the first ion implantation uses the same dosage level as in the second ion implantation.

12. A method of manufacturing a semiconductor device that includes a buried source structure and a shallow trench isolation structure, comprising the steps of:

providing a semiconductor substrate, and then forming a pad oxide layer and a mask layer over the substrate;

performing, a photolithographic and an etching operation to pattern the pad oxide layer and the mask layer, at the same time etching out a shallow first trench in the substrate;

performing a first ion implantation using the mask layer as a mask to form a buried doped region in the substrate underneath the first trench;

performing a photolithographic and an etching operation to form a deep second trench in the substrate for device isolation, wherein the second trench overlaps with a portion of the first trench, while the first trench is formed only in places where a common source region is ultimately formed;

depositing insulating material into the first trench and the second trench then removing the mask layer and the pad oxide layer so that a planar insulation layer whose upper surface is at the same height as the top of the substrate is obtained;

forming a polysilicon layer over the substrate, and then patterning the first polysilicon layer;

performing a second ion implantation using the polysilicon layer as a mask, thereby forming a surface source region and a drain region on each side of the polysilicon layer, such that the surface source region and the buried doped region are joined alternately to form a common source region; and forming a metallic interconnect structure above the polysilicon layer.

13. The method of claim 12, wherein the step of forming the mask layer includes depositing silicon nitride.

14. The method of claim 12, wherein the first trench has a depth smaller than the depth of the second trench.

15. The method of claim 12, wherein the step of forming the first trench includes performing an anisotropic dry etching operation of the substrate using the mask layer as a mask.

16. The method of claim 12, wherein the step of performing the first ion implantation includes implanting arsenic or phosphorus ions at a dosage level of about $10^{15}$ atoms/cm$^3$.

17. The method of claim 12, wherein after the step of forming the buried doped region, further includes performing another implantation for adjusting the voltage threshold of the device, and then depositing oxide to form a gate oxide layer.

18. The method of claim 12, wherein the step of forming the insulation layer includes depositing silicon dioxide to fill the first and the second trench using tetra-ethyl-ortho-silicate (TEOS) as a gaseous reagent in a chemical vapor deposition.

19. The method of claim 12, wherein the step of forming the second trench includes performing an anisotropic dry etching operation to etch the semiconductor substrate.

20. The method of claim 12, wherein after the step of depositing insulating material into the first and the second trench, further includes performing a chemical-mechanical polishing operation to planarize the insulation layer such that the top surface of the insulation layer is at the same height as the top of the substrate.

21. The method of claim 12, wherein the step of performing the second ion implantation includes implanting arsenic or phosphorus ions at a dosage level of about $10^{15}$ atoms/cm$^3$.

22. The method of claim 12, wherein the first ion implantation uses the same dosage level as in the second ion implantation.

* * * * *